United States Patent
Chen et al.

(10) Patent No.: US 8,729,700 B2
(45) Date of Patent: May 20, 2014

(54) MULTI-DIRECTION DESIGN FOR BUMP PAD STRUCTURES

(71) Applicant: Taiwan Semiconductor Manufacturing Company, Ltd., Hsin-Chu (TW)

(72) Inventors: Chih-Hua Chen, Zhubei (TW); Chen-Shien Chen, Zhubei (TW); Chen-Cheng Kuo, Chu-Pei (TW); Tzuan-Horng Liu, Longtan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/899,216

(22) Filed: May 21, 2013

(65) Prior Publication Data
US 2013/0249091 A1    Sep. 26, 2013

Related U.S. Application Data

(62) Division of application No. 12/700,004, filed on Feb. 4, 2010.

(51) Int. Cl.
*H01L 23/48* (2006.01)

(52) U.S. Cl.
USPC ............................................... 257/737

(58) Field of Classification Search
USPC ............................................... 257/737
See application file for complete search history.

(56) References Cited

U.S. PATENT DOCUMENTS 6,913,948 B2 *  7/2005  Caletka et al. ............... 438/108

* cited by examiner

*Primary Examiner* — Marvin Payen
(74) *Attorney, Agent, or Firm* — Slater and Matsil, L.L.P.

(57) ABSTRACT

An integrated circuit structure includes a semiconductor chip having a first region and a second region; a dielectric layer formed on the first region and the second region of the semiconductor chip; a first elongated under-bump metallization (UBM) connector formed in the dielectric layer and on the first region of the semiconductor chip and having a first longer axis extending in a first direction; and a second elongated UBM connector formed in the dielectric layer on the second region of the semiconductor chip and having a second longer axis extending in a second direction. The first direction is different from the second direction.

20 Claims, 6 Drawing Sheets

MULTI-DIRECTION DESIGN FOR BUMP PAD STRUCTURES

RELATED APPLICATIONS

This application is a divisional of, and claims the benefit of, U.S. patent application Ser. No. 12/700,004, filed on Feb. 4, 2010, and entitled "Multi-Direction Design for Bump Pad Structures," which application is incorporated by reference.

TECHNICAL FIELD

This disclosure relates generally to integrated circuits and more particularly to bump pad structures in semiconductor chips.

BACKGROUND

Modern integrated circuits are formed on semiconductor chips. To increase manufacturing throughput and lower manufacturing costs, the integrated circuits are manufactured in semiconductor wafers, each containing many identical semiconductor chips. After the integrated circuits are manufactured, semiconductor chips are sawed from the wafers and packaged before they can be used.

In typical packaging processes, semiconductor chips (also referred to as dies in the art) are first attached to package substrates. This includes physically securing the semiconductor chips on the package substrates and connecting bond pads on the semiconductor chips to bond pads on the package substrates. Underfill, which typically comprises epoxy, is used to further secure the bonding. The semiconductor chips may be bonded using either flip-chip bonding or wire bonding. The resulting structures are referred to as package assemblies.

It was observed that after the semiconductor chips are bonded onto the package substrates, the solders that join the semiconductor chips with the package substrates often suffer from cracking. This is caused by the stress resulting from the difference in coefficients of thermal expansion (CTE) between the package substrates and the semiconductor chips. The difference in CTEs of different layers of the package substrates and the semiconductor chips also results in stresses. It was observed that with the increase in the size of the package substrates and the semiconductor chips, the stress increases. As a result of the stress, the solder may crack, and delamination may occur between different layers in the semiconductor chips. Particularly, the delamination may occur between low-k dielectric layers in the semiconductor chips.

SUMMARY

In accordance with one aspect of the embodiment, an integrated circuit structure includes a plurality of bump pad structures distributed over a major surface of a semiconductor chip. A first region of the semiconductor chip has formed thereon a first bump pad structure including a first elongated under bump metallurgy (UBM) connector in a dielectric layer, wherein a first longer axis of the first elongated UBM connector extends in a first direction. A second region of the semiconductor chip has formed thereon a second bump pad structure including a second elongated UBM connector in the dielectric layer. A second longer axis of the second elongated UBM connector extends in a second direction different from the first direction.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments and do not limit the scope of the disclosure.

Novel bump pad structures in semiconductor chips are presented in accordance with an embodiment. The variations of the embodiment are then discussed. Throughout the various views and illustrative embodiments, like reference numbers are used to designate like elements.

Figure 1A:
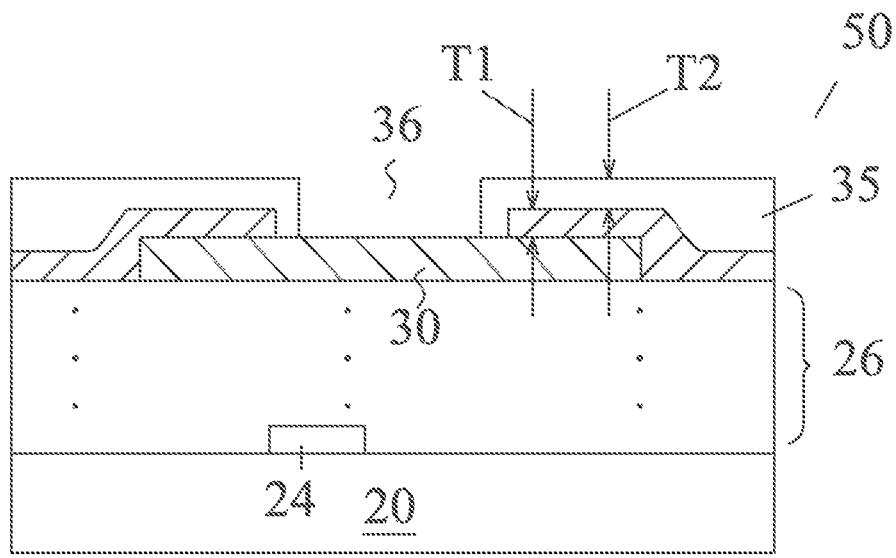
FIGS. 1A and 1B each illustrate a metal pad over a semiconductor substrate, wherein a dielectric layer is formed over the metal pad, with an opening in the dielectric layer.
Figure 1B:
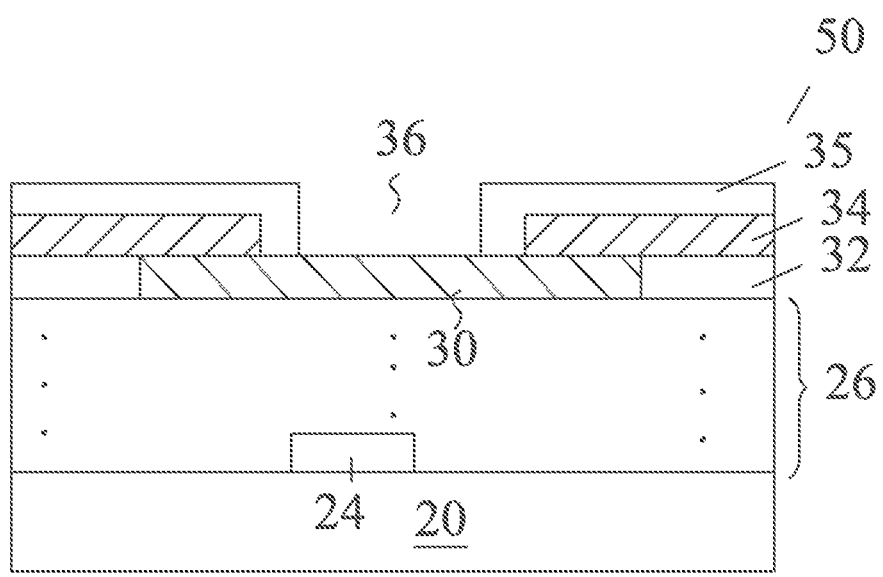
Figure 2:
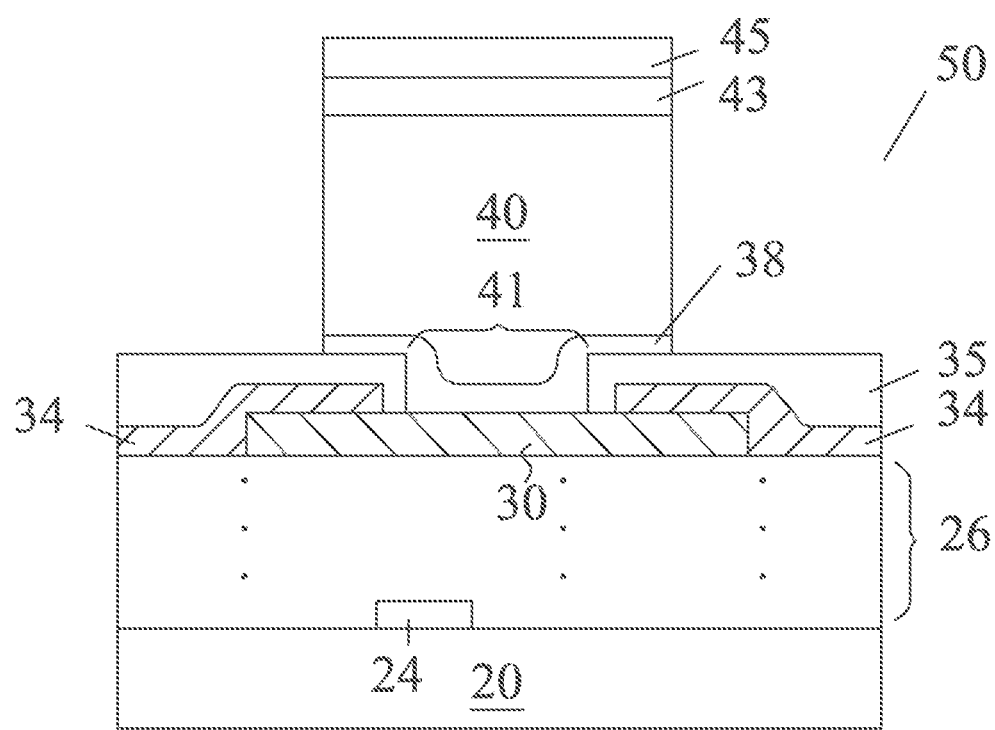
FIG. 2 illustrates a bump pad structure in accordance with an embodiment.

FIGS. 1A through 2 illustrate intermediate stages in the manufacturing of a bump pad structure and a metal bump. FIG. 1A illustrates a cross-sectional view showing a portion of chip 50, which includes substrate 20, on which active circuit 24 is formed. Substrate 20 may be a semiconductor substrate formed of commonly used semiconductor materials, such as silicon, silicon germanium, or the like. Active circuit 24 may include complementary metal-oxide-semiconductor (CMOS) transistors, resistors, capacitors, and the like. Interconnect structure 26 is formed over active circuit 24, and is used to interconnect portions of active circuit 24, and to connect active circuit 24 to bumps. Interconnect structure 26 includes a plurality of metallization layers comprising metal lines and vias (not shown) in a plurality of dielectric layers. The dielectric layers in interconnect structure 26 may be low-k dielectric layers.

Metal pad 30 is formed over interconnect structure 26 and may be electrically connected to active circuit 24 through interconnect structure 26. Metal pad 30 may comprise aluminum, and hence may also be referred to as aluminum pad 30, although it may also be formed of, or include, other materials, such as copper, silver, gold, nickel, tungsten, alloys thereof, and/or multi-layers thereof. In an embodiment, metal pad 30 is formed of aluminum copper (AlCu).

Dielectric layer 34 is formed over interconnect structure 26. Dielectric layer 34 may also be referred to in the art as being a passivation layer or a buffer layer, and may be formed of a photo resist material, such as polyimide or polybenzoxazole (PBO). Alternatively, dielectric layer 34 may be formed of other dielectric materials, such as silicon oxide, silicon nitride, un-doped silicate glass (USG), and/or multi-layers thereof. The thickness T1 of dielectric layer 34 may be between about 4 μm and about 10 μm. Dielectric layer 34 comprises a portion covering edge portions of metal pad 30 and an opening exposing a central portion of metal pad 30. In an embodiment, dielectric layer 34 comprises a portion at a same level as metal pad 30. In alternative embodiments, as shown in FIG. 1B, an entirety of dielectric layer 34 is higher than metal pad 30, and an additional dielectric layer 32 is formed under dielectric layer 34 and substantially level with metal pad 30. In this embodiment, dielectric layers 32 and 34 may also be referred to as passivation-1 and passivation-2, respectively. Dielectric layer 32 may be formed of a material selected from essentially the same group of materials for forming dielectric layer 34. Polyimide layer 35 is formed over dielectric layer 34, with opening 36 being formed in polyimide layer 35. Metal pad 30 is exposed through opening 36. Further, polyimide layer 35 may extend into the opening in dielectric layer 34. Thickness T2 of polyimide layer 35 may be greater than about 1 μm, or even greater than about 10 μm. Throughout the description, opening 36 is referred to as an under bump metallurgy (UBM) opening since UBM 38 (not shown in FIGS. 1A and 1B, please refer to FIG. 2) is formed in opening 36. UBM 38 is elongated.

Referring to FIG. 2, UBM 38 is filled into UBM opening 36 and contacts metal pad 30. In an embodiment, UBM 38 is formed of a composite layer comprising a titanium layer and a copper layer over the titanium layer. In other embodiments, UBM 38 may include other metal layers, such as a nickel layer or a gold layer. UBM 38 may include a portion inside UBM opening 36 and additional portions over polyimide layer 35. The portion of UBM 38 inside UBM opening 36 is referred to as UBM connector 41 hereinafter, which electrically connects the upper portion of UBM 38 and the overlying copper bump 40 to the underlying metal pad 30. Accordingly, in the embodiments shown in FIGS. 3A through 7, the shapes and the extending directions of elongated UBM openings 36 will also be the same as the shapes and the extending directions, respectively, of the respective UBM connectors 41. In an embodiment, UBM 38 (including UBM connector 41) and underlying metal pad 30 in combination are referred to as a bump pad structure.

Copper bump 40 is formed over UBM 38. Copper bump 40 may be formed by forming a mask (not shown) over UBM 38, patterning the mask to form an opening, through which a portion of UBM 38 is exposed, and plating a metallic material into the opening in the mask. The metallic material may comprise copper, and hence the resulting bump is referred to copper bump 40, although other metals may be used. Optionally, an additional layer, such as nickel layer 43, and possibly solder layer 45, may be plated over copper bump 40 and in the opening in the mask. In alternative embodiments, instead of forming a copper bump, a solder ball may be formed on UBM 38. The mask may then be removed, followed by the removal of the portion of UBM 38 uncovered by copper bump 40.

Figure 3A:
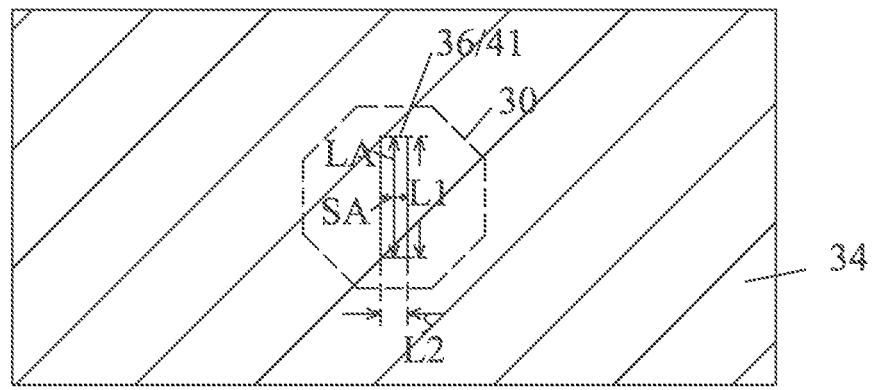
FIGS. 3A through 3D illustrate top views of under bump metallurgy (UBM) connectors having different shapes.
Figure 3B:
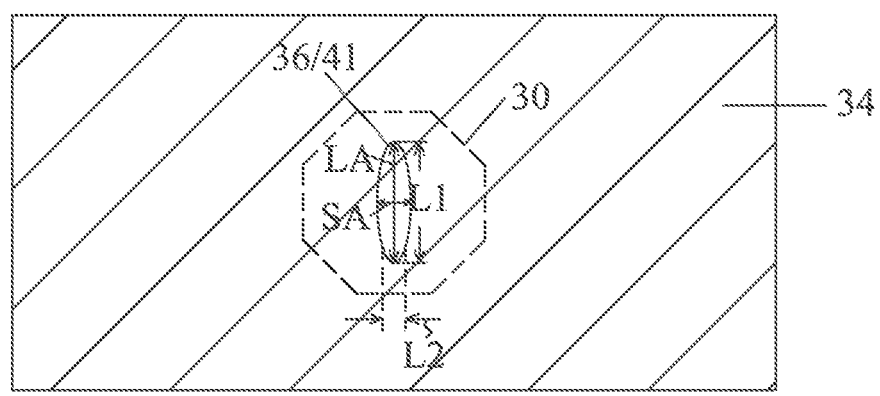
Figure 3C:
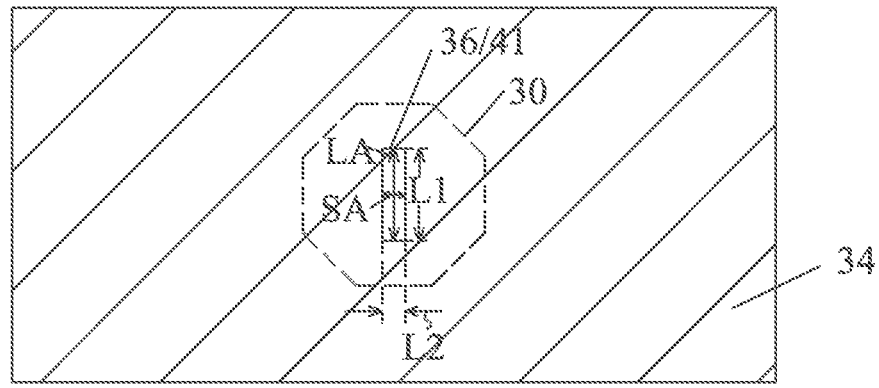
Figure 3D:
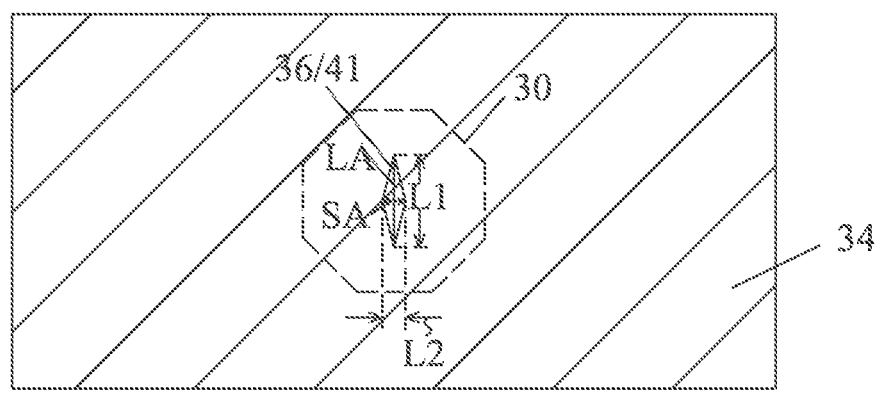

FIG. 3A illustrates a top view of a portion of the structure as shown in FIGS. 1A and 1B. For simplicity, copper bump 40 and portions of UBM 38 are not shown. In the top view, UBM opening 36 is an elongated opening with a longer axis LA having length L1 and a shorter axis SA having length L2, wherein shorter axis SA is perpendicular to the longer axis LA. Length L1 may be greater than about 1.5 times, 2 times, or even 3 times, length L2. In an embodiment, as shown in FIG. 3A, UBM opening 36 has a rectangular shape. The four corners of the rectangular UBM opening 36 may be rounded. The elongated UBM opening 36 may also have other shapes. FIGS. 3B through 3D illustrate the top views of alternative elongated UBM openings 36. For example, in FIG. 3B, the elongated UBM opening 36 has an ellipse shape. In FIG. 3C, the elongated UBM opening 36 has a rectangular shape with sharp corners. In FIG. 3D, the elongated UBM opening 36 has a diamond shape. The longer axis LA and the shorter axis SA are marked in each of FIGS. 3B through 3D. Since UBM connector 41 fills UBM opening 36, UBM connector 41 is also elongated, and the shapes and dimensions of the elongated UBM connector 41 will not be repeated herein.

Figure 4:
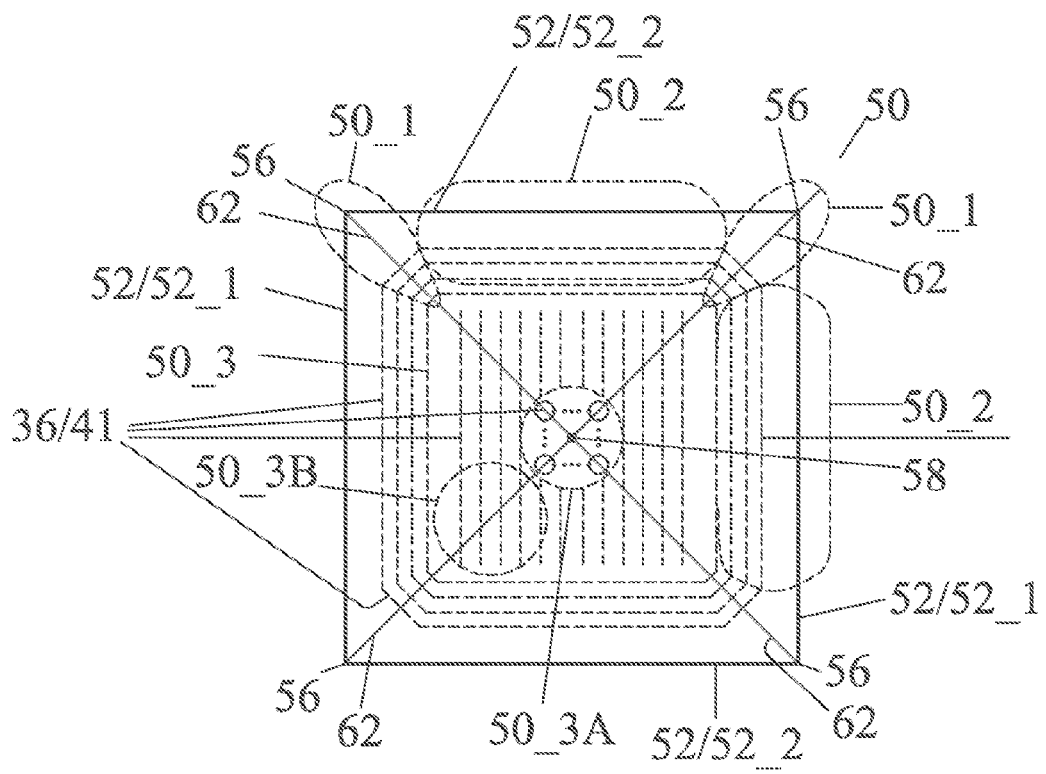
FIGS. 4 through 7 are top views of UBM connectors in accordance with embodiments.

FIG. 4 schematically illustrates a top view of semiconductor chip 50, which includes four edges 52. In an embodiment, semiconductor chip 50 has a square shape with edges 52 having the same length. In alternative embodiments (FIG. 6), semiconductor chip 50 has a rectangular shape with edges 52_1 having a different length than edges 52_2.

Chip 50 includes chip regions 50_1, 50_2, and 50_3 (including 50_3A and 50_3B). Chip regions 50_1 are corner chip regions adjacent to corners 56 of chip 50. Chip regions 50_2 are edge chip regions, each adjacent to one of the edges 52 of chip 50. It is noted that corner chip regions 50_1 are not considered as portions of edge chip regions 50_2 although corner chip regions 50_1 are also adjacent to edges 52. Center chip region 50_3 is adjacent to, or even comprises, center 58 of chip 50. Chip 50 includes a plurality of bump pad structures (as illustrated in FIGS. 1A through 3D) distributed throughout chip 50, with each of the bump pad structures including one of UBM openings 36, the overlying UBM 38, and underlying metal pad 30. Throughout the description, elongated UBM connectors 41 are illustrated as short lines, with the extending directions of the short lines representing the directions of the longer axes of the respective elongated UBM connectors 41. In an embodiment, center chip region 50_3 may be a square region having a length smaller than about 7,000 μm. In alternative embodiment, center chip region 50_3 may be a square region having a length less than about 50 percent, or even less than about 25 percent of a length of chip edges 52.

FIG. 4 illustrate lines 62, which connect center 58 of chip 50 to corners 56. In an embodiment, elongated UBM connectors 41 in corner chip regions 50_1 have their longer axis perpendicular to respective lines 62. Elongated UBM connectors 41 in edge chip regions 50_2 have their longer axis extending parallel to the respective edges 52 (the edge closest to the respective one of the edge chip regions 50_2). On the other hand, elongated UBM connectors 41 in center chip region 50_3 may have their longer axis extending in any direction.

It is observed that the stresses asserted onto bump pad structures in different chip regions are different. For example, the stresses applied to the bump pad structures in corner chip regions 50_1 may be the greatest, and the stresses applied to the bump pad structures in center chip region 50_3 may be the smallest. By allowing elongated UBM connectors 41 to have their longer axes not parallel to, and possibly perpendicular to (if the respective chip 50 has a square shape), the direction wherein the stresses are greatest, the bond structures suffer from smaller stresses.

Referring again to FIG. 4, since the stresses asserted on the bump pad structures in center chip region 50_3 are low, the UBM connectors 41 in center chip region 50_3 may have any shape, such as a circular shape, a square shape, an octagon shape, a hexagon shape, or the like. In an embodiment, UBM connectors 41 in center chip region 50_3 may have a symmetric shape without a shorter axis perpendicular to a longer axis. For example, FIG. 4 schematically illustrates octagon-shaped UBM connectors 41 in center chip region 50_3.

Figure 5:
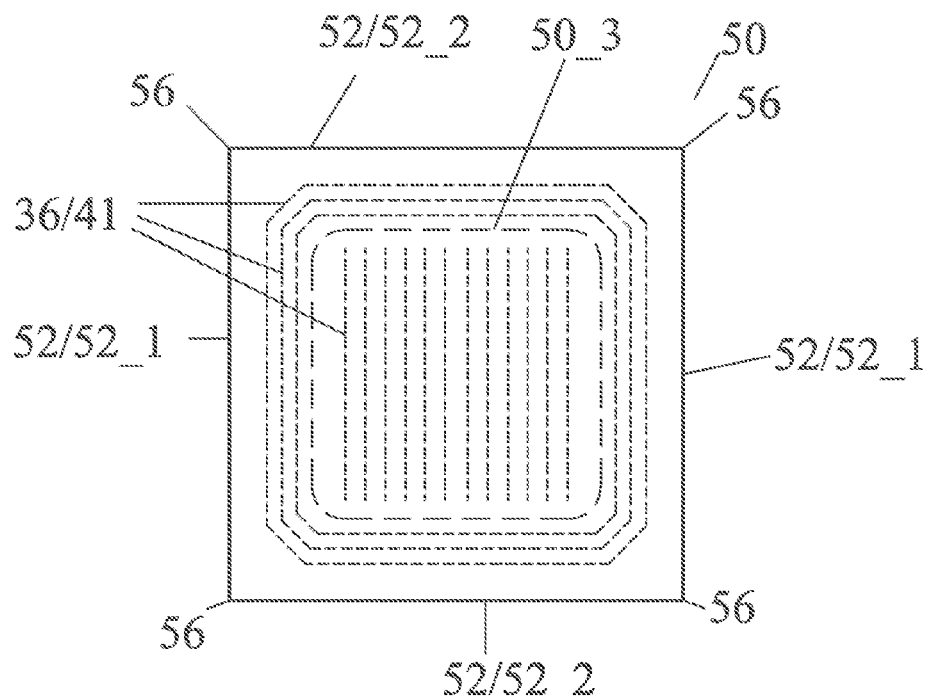

FIG. 5 illustrates an embodiment, wherein all of the elongated UBM connectors 41 in center chip region 50_3 extend in a same direction, which may be in any direction parallel to any of the edges, or in a random direction.

Figure 6:
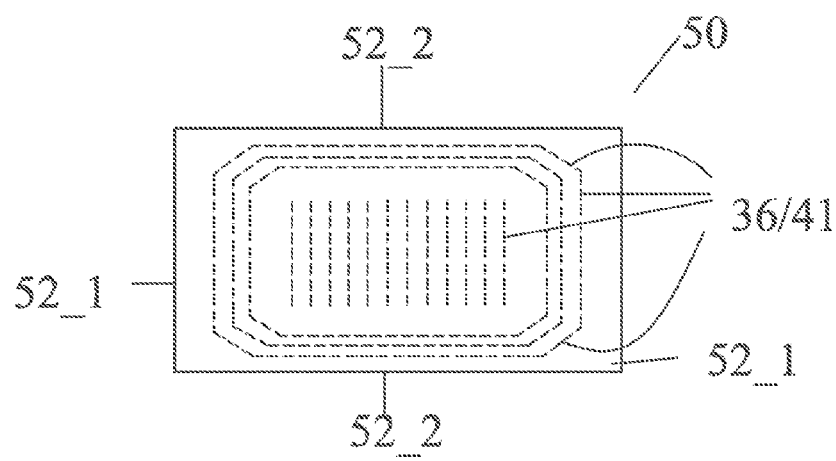

FIG. 6 illustrates another embodiment wherein chip 50 has a rectangular shape with a longer edge and a shorter edge. Similar to the embodiment discussed in preceding paragraphs, chip 50 may also be divided into different chip regions, with the elongated UBM connectors 41 in different chip regions having longer axes extending in different directions.

Figure 7:
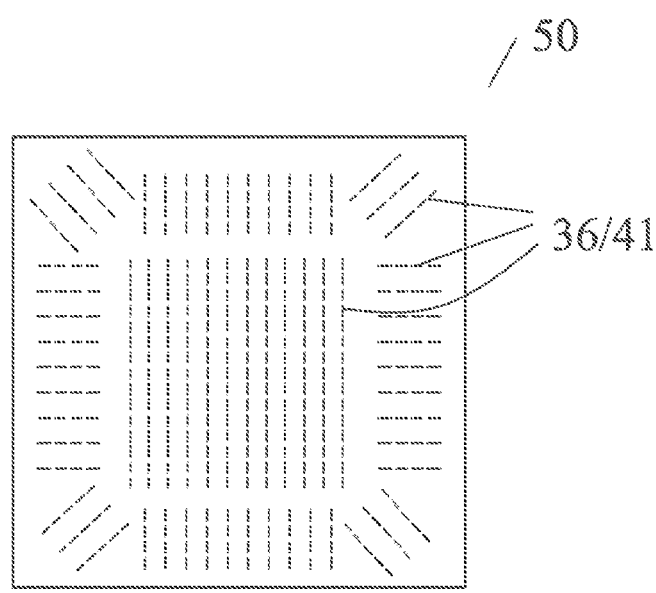

FIG. 7 illustrates yet another embodiment, wherein the elongated UBM connectors 41 in edge chip regions and corner chip regions arranged as a radiating pattern.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
   a semiconductor chip having a first region and a second region;
   a dielectric layer formed on the first region and the second region of the semiconductor chip;
   a first under-bump metallization (UBM) connector formed in the dielectric layer on the first region of the semiconductor chip and having a first shape in a top view; and
   a second UBM connector formed in the dielectric layer on the second region of the semiconductor chip and having a second shape in a top view, wherein the first shape is different from the second shape.

2. The integrated circuit structure of claim 1, further comprising a metal pad directly under the first UBM connector.

3. The integrated circuit structure of claim 1, wherein the first UBM connector comprises a longer axis with a first length and a shorter axis with a second length perpendicular to the longer axis, and wherein a ratio of the first length to the second length is greater than about 1.5.

4. The integrated circuit structure of claim 1, wherein the second UBM connector is not elongated, and wherein the second region is a center chip region comprising a center of the semiconductor chip.

5. The integrated circuit structure of claim 4, wherein the first region is adjacent a first edge of the semiconductor chip, and wherein a longer axis of the first UBM connector is parallel to the first edge.

6. The integrated circuit structure of claim 4, wherein the first region is adjacent a corner of the semiconductor chip, and wherein a longer axis of the first UBM connector is not parallel to any edge of the semiconductor chip.

7. The integrated circuit structure of claim 4, wherein a longer axis of the first UBM connector is perpendicular to a line connecting the center of the semiconductor chip and a corner.

8. An integrated circuit structure comprising:
   a first metal pad disposed in a first region of a semiconductor chip;
   a second metal pad disposed in a second region of a semiconductor chip;
   a dielectric layer formed on the first region and the second region of the semiconductor chip;
   a first under-bump metallization (UBM) connector formed in the dielectric layer on the first region of the semiconductor chip and having an elongated first shape in a top view, the first UBM disposed over and in electrical contact with the first metal pad; and
   a second UBM connector formed in the dielectric layer on the second region of the semiconductor chip and having a second shape in a top view, wherein the first shape is different from the second shape, the second UBM connector disposed over and in electrical contact with the second metal pad.

9. The integrated circuit structure of claim 8, wherein the first region is adjacent a first edge of the semiconductor chip, and wherein the longer axis of the first UBM connector is parallel to the first edge.

10. The integrated circuit structure of claim 9, wherein the second region is a center chip region comprising a center of the semiconductor chip, the second region separate from the first region.

11. The integrated circuit structure of claim 10, wherein the first UBM connector comprises a longer axis with a first length and a shorter axis with a second length perpendicular to the longer axis, and wherein a ratio of the first length to the second length is greater than about 1.5.

12. The integrated circuit structure of claim 11, wherein the longer axis of the first UBM connector is perpendicular to a line connecting the center of the semiconductor chip and a corner.

13. The integrated circuit structure of claim 10, wherein the first region is adjacent to a corner of the semiconductor chip, and wherein the longer axis of the first UBM connector is not parallel to any edge of the semiconductor chip.

14. A device comprising:
   a plurality of first metal pads disposed in a first region of a semiconductor substrate;
   a plurality of second metal pads disposed in a second region of the semiconductor substrate;
   a dielectric layer formed in the first region and the second region and over the plurality of first metal pads and the plurality of second metal pads;
   a plurality of first under-bump metallization (UBM) connectors formed in the dielectric layer over and each in electrical contact with respective ones of the plurality of first metal pads, each of the first UBM connectors having a first orientation; and
   a plurality of second UBM connectors formed in the dielectric layer over and each in electrical contact with respective ones of the plurality of second metals pads, each of the second UBM connectors having a second orientation different from the first orientation.

15. The device of claim 14, wherein the first region is a first edge chip region adjacent a first edge of the semiconductor substrate and wherein the second region is a second edge chip region adjacent a second edge of the semiconductor substrate, wherein the first edge is perpendicular to the second edge.

16. The device of claim 14, wherein the first region is a first edge chip region adjacent a first edge of the semiconductor substrate and wherein the second region is a corner chip region adjacent a corner of the semiconductor substrate, and wherein the second orientation is not parallel and not perpendicular to the first orientation.

17. The device of claim 16 wherein the second orientation is perpendicular to a line connecting the center of the semiconductor substrate and a corner.

18. The device of claim 14, wherein each of the plurality of first UBM connectors and the plurality of second UBM connectors has a rectangular shape.

19. The device of claim 14, wherein each of the plurality of first elongated UBM connectors and the plurality of second UBM connectors has a diamond shape.

20. The device of claim 14, wherein each of the plurality of first UBM connectors and the plurality of second UBM connectors has an ellipse shape.

* * * * *